(12) United States Patent
Ono

(10) Patent No.: US 6,536,015 B2
(45) Date of Patent: Mar. 18, 2003

(54) APPARATUS AND METHOD OF CORRECTING LAYOUT PATTERN DATA, METHOD OF MANUFACTURING SEMICONDUCTOR DEVICES AND RECORDING MEDIUM

(75) Inventor: Yusaku Ono, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 60 days.

(21) Appl. No.: 09/810,504

(22) Filed: Mar. 19, 2001

(65) Prior Publication Data

US 2002/0007481 A1 Jan. 17, 2002

(30) Foreign Application Priority Data

Jul. 5, 2000 (JP) .................................... 2000-203866
Aug. 31, 2000 (JP) .................................... 2000-262901

(51) Int. Cl.[7] ............................................. G06F 17/50
(52) U.S. Cl. ............................ 716/2; 716/19; 382/144
(58) Field of Search ........................... 716/19, 20, 21, 716/2, 3, 4, 5, 11–18; 382/144, 145, 149, 199; G06F 17/50

(56) References Cited

U.S. PATENT DOCUMENTS

| | | | | |
|---|---|---|---|---|
| 5,028,782 A | * | 7/1991 | Nakajima | 250/587 |
| 5,247,456 A | * | 9/1993 | Ohe et al. | 716/9 |
| 5,786,112 A | * | 7/1998 | Okamoto et al. | 430/22 |
| 5,845,008 A | * | 12/1998 | Katoh et al. | 382/135 |
| 6,077,310 A | * | 6/2000 | Yamamoto et al. | 430/30 |
| 6,211,505 B1 | * | 4/2001 | Nagamatsu | 250/205 |
| 6,289,493 B1 | * | 9/2001 | Kita | 716/11 |
| 6,298,473 B1 | * | 10/2001 | Ono et al. | 430/30 |
| 6,335,981 B1 | * | 1/2002 | Harazaki | 382/144 |

FOREIGN PATENT DOCUMENTS

| | | | | |
|---|---|---|---|---|
| JP | 02-270326 | 11/1990 | | H01L/21/82 |
| JP | 04-111447 | 4/1992 | | H01L/21/82 |
| JP | 04-206550 | 7/1992 | | H01L/21/82 |
| JP | 04-218944 | 8/1992 | | H01L/21/82 |
| JP | 06-349943 | 12/1994 | | H01L/21/82 |
| JP | 09-034101 | 2/1997 | | G03F/1/08 |
| JP | 10-187778 | 7/1998 | | G06F/17/50 |

OTHER PUBLICATIONS

Hierarchical DRC Tool, Made By Mentor Co., (Calibre V8.7_22.1) Release Note.
Hierarchical DRC Tool, Made By Avant! Co. (Hercules 1998.4) Manual.

* cited by examiner

Primary Examiner—Don Wong
Assistant Examiner—Trinh Vo Dinh
(74) Attorney, Agent, or Firm—McDermott, Will & Emery

(57) ABSTRACT

The invention provides an apparatus and a method of correcting layout pattern. The apparatus has a deletion region side extracting section for extracting sides of a region to be deleted having a predetermined shape such as protrusion, notch or step in a layout pattern of a circuit, a deletion-use pattern generator for generating a deletion-use pattern based on the extracted sides, and an operating section for executing a predetermined operation to the layout pattern with the deletion-use pattern so as to remove the region to be deleted from the original layout pattern.

18 Claims, 13 Drawing Sheets

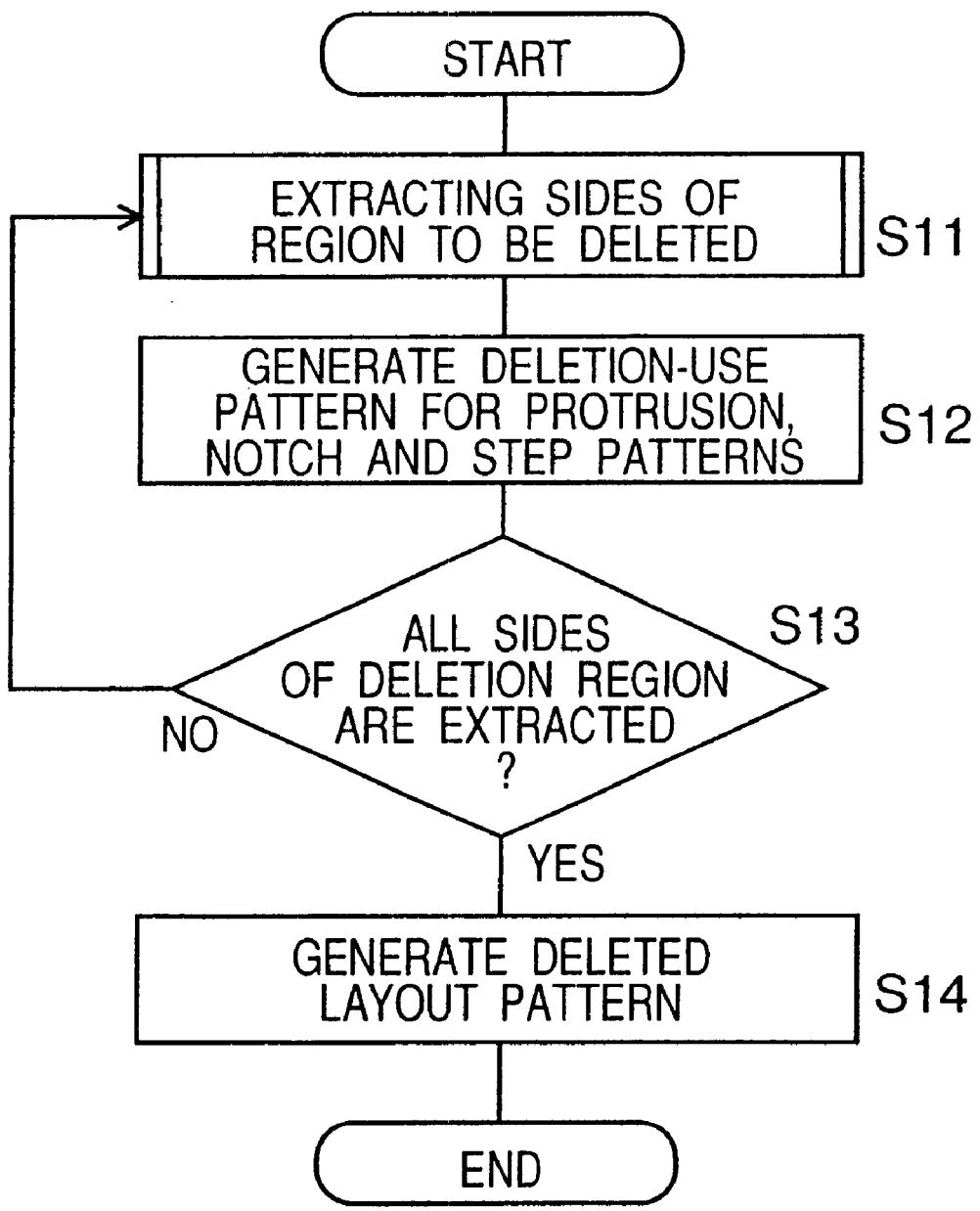

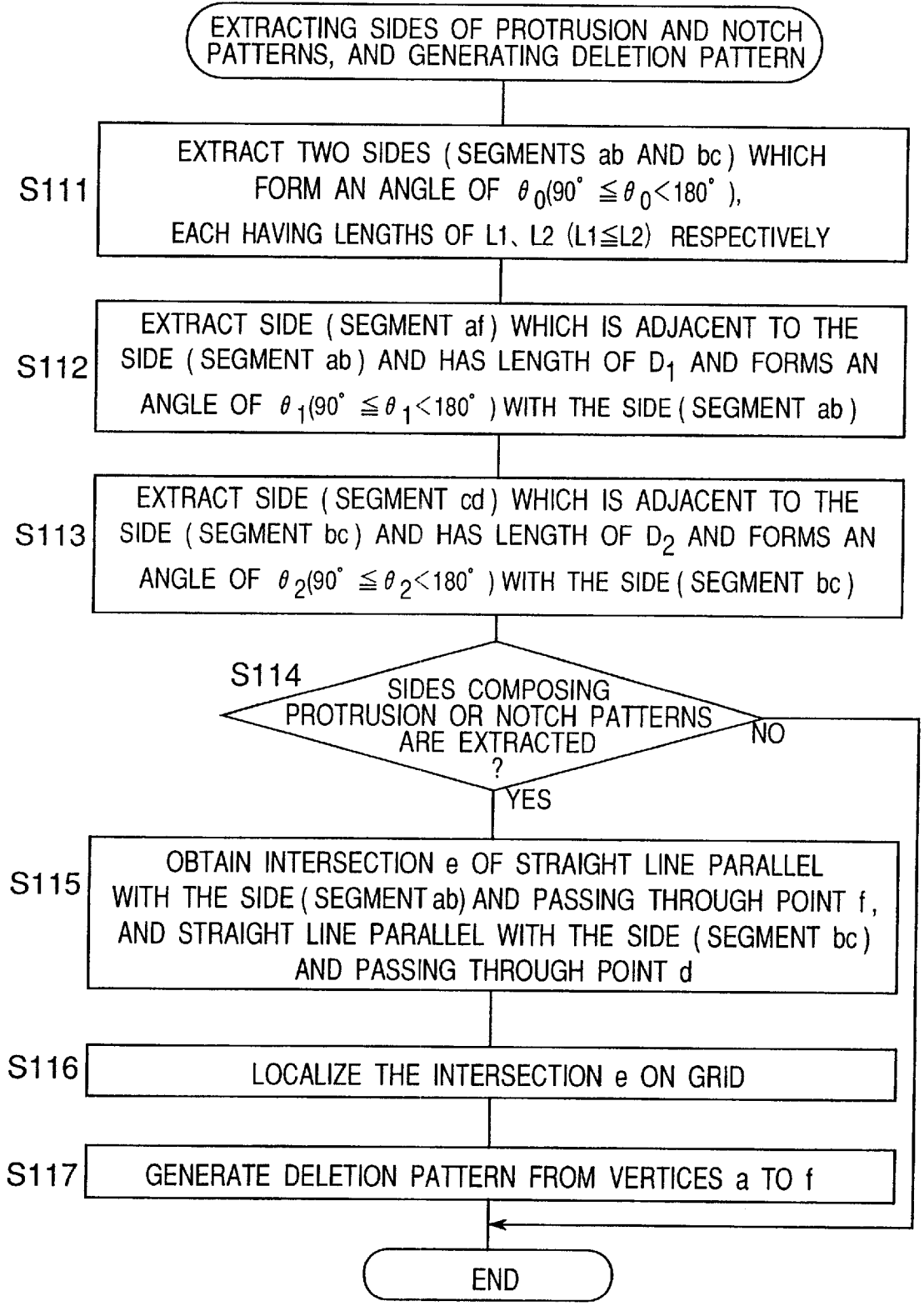

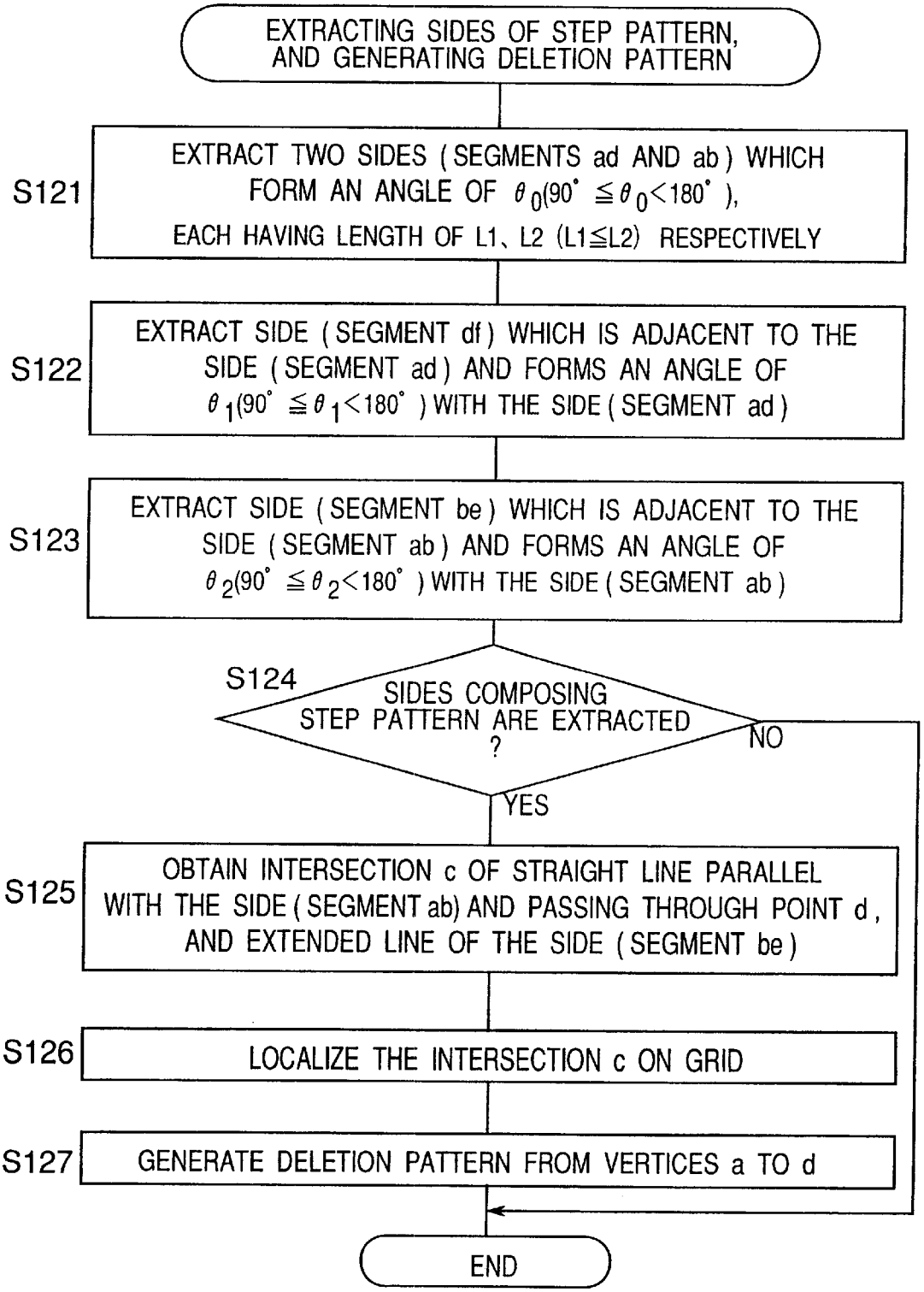

APPARATUS AND METHOD OF CORRECTING LAYOUT PATTERN DATA, METHOD OF MANUFACTURING SEMICONDUCTOR DEVICES AND RECORDING MEDIUM

This application is based on Japanese Patent application Nos. 2000-203886 and 2000-262901, the contents of which are incorporated herein by reference.

BACKGROUND OF THE INVENTION

1. Field of the Invention

The present invention relates to an apparatus and method of correcting a pattern skew caused in a pattern forming process such as optical lithography and etching to be utilized for manufacturing a semiconductor device, and a method of manufacturing a semiconductor device using the correction.

2. Description of the Related Art

At present, the design rule of a semiconductor device reaches a level of 0.15 μm and this level is smaller than a wavelength (ex. 0.248 μm for KrF excimer laser) of a light source of a stepper for transcription. In such a situation, a resolution characteristic is extremely deteriorated, and therefore a special lithography technology such as a modified illuminating technology is used to improve the resolution.

Even though the resolution characteristic is improved by using this special lithography technology, the fidelity of a pattern is deteriorated. Moreover, since a pattern becomes minute also in another process such as an etching process, a fluctuation of the dimension of the pattern occurs due to density difference of the pattern.

In order to deal with these problems, an OPC (Optical Proximity Effect Correction) technology which modifies a design layout pattern to obtain a desired pattern is widely used. There exist three kinds of OPC methods including a model based OPC, a rule based OPC and a combination of these two OPC methods. The model based OPC modifies a pattern based on a result of simulation. The rule based OPC specifies a specification (OPC rule) to modify a design layout pattern, taking into account phenomenal features (widths of respective patterns, a distance between adjacent patterns, a distance from a corner portion) of the design layout pattern, and then modifies the design layout pattern based on this rule.

As the pattern becomes minute, more complicated OPC process is to be required, and thus output pattern data after OPC become complicated polygonal. For this reason, a lot of figures having very small protrusions, notches or steps shape are generated in the output pattern data after OPC. Such a lot of figures including protrusion figures, notch-shaped figures or step-shaped figures increases a number of vertices of the figures, resulting in a problem of data amount to be increased.

FIG. 11 shows the layout pattern data after the OPC process. In FIG. 11, patterns represented by broken lines are those before the OPC process. A pattern C1 is a pattern applied by the OPC process. Patterns of protrusion 13 and 15, notches 11, 14 and 16, and steps 12, 17 and 18 are added to the patterns before the OPC process. Even if such very small protrusive, notch-shaped or step-shaped patterns are deleted, there arises no optical problem.

A method of deleting very small protrusions and notches generated after the conventional OPC will be explained below. There exist two kinds of methods of deleting protrusions and notches. One of them is a method using spacing check to be used in a design rule check (DRC) tool, and the other is a method using sizing process. There will be explained below these methods.

First, the deleting method using spacing check will be explained.

FIG. 12A shows an example of a protrusion which is generated in the OPC process. In the case where this protrusion is deleted, a protrusion deletion-use figure C is generated on a portion of which width is W or less by the DRC tool as shown in FIG. 12B. The figure C is subtracted (NOT operation) from the original layout data so that the protrusion figure is deleted (see FIG. 12C). The similar manner is applied for the notch-shaped figure. The notch figure can be deleted by generating a notch deletion-use figure using a gap of the figures and adding (OR operation) this figure to the original pattern. FIG. 14A shows a result of reducing or deleting the protrusion figures and notch figures from the pattern shown in FIG. 11 in this method. As shown in the drawing, the notch FIGS. 11 and 14 and the protrusion FIG. 15 are deleted.

However, this method cannot delete protrusion and notch figures such as patterns 13 and 16. This is because in theses figures each side composing the respective figure does not have a side in a opposed side, and thus the width and gap of these figures are judged as large, and deletion-use figures cannot be generated.

There will be explained the deleting method using sizing process.

FIG. 13A shows an example of the notch generated in the OPC process. In the case where this notch is deleted, executed are over-sizing process and under-sizing process with ½ of a width S of a notch figure N to be deleted. FIG. 13B shows a figure after the over-sizing process. The notch with the width S or less is buried by the over-sizing process. Thereafter, the under-sizing process is executed so that layout data pattern shown in FIG. 13C in which the notch figure has been deleted can be obtained. Similarly, the protrusion figure can be deleted by the over-sizing process after the under-sizing process. FIG. 14B shows a result that the protrusion and notch figures are deleted from the data pattern shown in FIG. 11 by this method. As shown in the diagram, the notch FIGS. 11, 14 and 16 are deleted.

In such the deleting methods using the sizing processes, there is a problem in which acute figures such as patterns 24 and 25 are generated depending on a sizing amount, due to the under-sizing and over-sizing processes for protrusion figures having inclined lines or the over-sizing and under-sizing processes for notch figures having inclined lines. When a sizing amount is increased in order to avoid this generation, for deletion of the protrusion figures, pattern would disappear due to the under-sizing process, and for deletion of the notch figures, gaps between adjacent patterns would be filled by the over-sizing process. As a result, arbitrary protrusion figures and notch figures cannot be deleted.

Further, step patterns such as patterns 12, 17 and 18 shown in FIG. 11 cannot be deleted by the above-mentioned methods using spacing check and sizing.

Therefore, even if the spacing check or sizing process is used, there is a lot of figures of multiple-vertices having plural protrusions, notches and steps exist which are not able to be deleted. Thus, there is a problem in which a data amount after the OPC process increases.

SUMMARY OF THE INVENTION

The present invention is devised in order to solve the above problems, and it is an object of the present invention to provide an apparatus and method of correcting layout pattern, which can reduce protrusive regions, notch-shaped regions and step-shaped regions from design layout patterns in manufacturing a semiconductor device to reduce a data amount of the layout patterns.

In a first aspect of the invention, an apparatus of correcting layout pattern data comprises a side extracting section for extracting sides composing a region to be deleted having a predetermined shape in a layout pattern of a circuit, a deletion-use pattern generator for generating a deletion-use pattern which is used to delete the region to be deleted, based on the extracted sides, and an operation section for executing a predetermined operation to the layout pattern with the deletion-use pattern to remove the region to be deleted from the original layout pattern.

The side extracting section may extract four sides from the layout pattern. The first side has a predetermined length. The second side has a predetermined length longer than the first side and forms a predetermined angle with the first side. The third side is adjacent to the first side and forms a predetermined angle with the first side. The fourth side is adjacent to the second side and forms a predetermined angle with the second side.

The deletion-use pattern generator may determine an intersectional point of a first straight line with a second straight line, and generate, using the intersectional point, the deletion-use pattern to delete a protrusion or notch region. The first straight line extends parallel with the first side and passing through an end of the third side spaced from the first side. The second straight line extends parallel with the second side and passing through an end of the fourth side spaced from the second side.

The deletion-use pattern generator may determine an intersectional point of a straight line which extends parallel with the second side and passes through an end of the third side contacting with the first side, and an extended line of the fourth side, and generate using the intersectional point the deletion-use pattern for deleting a step shaped region.

When the each side of the pattern is specified according to coordinate on a predetermined grid, and if the intersectional point is not localized on the grid, one point on the grid may be selected so that a difference in layout pattern shapes becomes minimum between before and after deleting the region to be deleted, and the coordinate of the intersectional point may be localized on the selected point on the grid.

In a second aspect of the invention, a method of correcting layout pattern data comprises extracting sides composing a region to be deleted having a predetermined shape in a layout pattern of a circuit, generating a deletion-use pattern which is used to delete the region to be deleted, based on the extracted sides, and executing a predetermined operation to the layout pattern with the deletion-use pattern to remove the region to be deleted from the original layout pattern.

In a third aspect of the invention, an information recording medium stores a program for controlling an apparatus of correcting a layout pattern of a circuit. The program makes the apparatus execute the following functions. The functions comprises a side extracting function for extracting sides composing a region to be deleted having a predetermined shape in a layout pattern of a circuit, a deletion-use pattern generating function for generating a deletion-use pattern which is used to delete the region to be deleted, based on the extracted sides, and a figure operation function for executing a predetermined operation to the layout pattern with the deletion-use pattern to remove the region to be deleted from the original layout pattern.

Advantages of the Invention

According to the invention, protrusion regions, notch regions and step regions can be specified in a simple process to remove those regions from the layout pattern. Therefore, since patterns such as protrusions, notches and steps in a layout pattern can be removed from a layout pattern in a simple process, pattern data with less number of vertices can be obtained, and thus increase of data amount of a compensated layout pattern can be suppressed.

BRIEF DESCRIPTION OF THE DRAWINGS

FIG. 2 is a flow chart showing an operation of the layout pattern data correcting apparatus according to the present invention.

FIG. 3 is a flow chart showing a process for extracting sides of protrusion region or notch-shaped region and a process for generating a deletion-use figure.

FIG. 4 is a flow chart showing a process for extracting sides of step-shaped regions and a process for generating a deletion-use figure.

DESCRIPTION OF THE PREFERRED EMBODIMENT

With reference to the attached drawings, a preferred embodiment of a layout pattern data correcting apparatus according to the present invention will be described below. A layout pattern data correcting apparatus described below is an apparatus for designing mask patterns to be used for manufacture of a semiconductor device. The layout pattern data correcting apparatus extracts a group of sides that have a predetermined relationship in length, angle and the like so as to detect a region (figure) which causes an increase of a data amount of layout patterns such as protrusion, notch and step included in the layout patterns. When detecting these regions (figures), the apparatus removes the detected regions (figures) from the original layout pattern so as to obtain corrected layout pattern data. As a result, a data amount of the layout pattern can be diminished. The details will be explained below.

Structure of Layout Pattern Data Correcting Apparatus

Figure 1A:
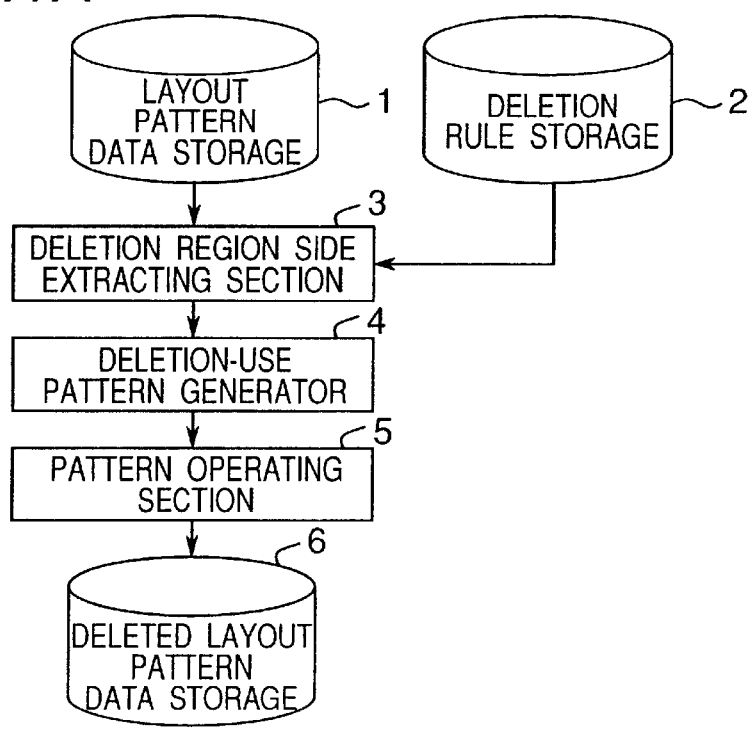
FIG. 1A is a functional block diagram of a layout pattern data correcting apparatus according to the present invention.

FIG. 1A is a functional block diagram of the layout pattern data correcting apparatus according to the present invention. The layout pattern data correcting apparatus comprises a layout pattern data storage 1, a deletion rule storage 2, a deletion region side extracting section 3, a deletion-use pattern generator 4, a pattern operating section 5, and a deleted layout pattern data storage 6.

The layout pattern data storage 1 holds layout pattern data of a circuit before correction, for example, layout pattern data after an optical proximity effect correcting (OPC) process. The deletion rule storage 2 holds rules for deleting patterns of protrusions, notches and steps to be deleted. The deletion region side extracting section 3 extracts a part or all of sides composing regions of protrusions, notches or steps which are to be deleted (hereinafter, referred to as "region to be deleted"). The deletion-use pattern generator 4 generates a figure which is used for removing the region to be deleted from the layout pattern based on the extracted sides (hereinafter, the figure is referred to as "deletion-use pattern"). The figure operating section 5 performs operation of figure data using the deletion-use pattern generated for deleting the region to be deleted and the original layout pattern. The deleted layout pattern data storage 6 holds layout pattern data after the deletion of the region to be deleted, namely, data after correction.

Figure 1B:
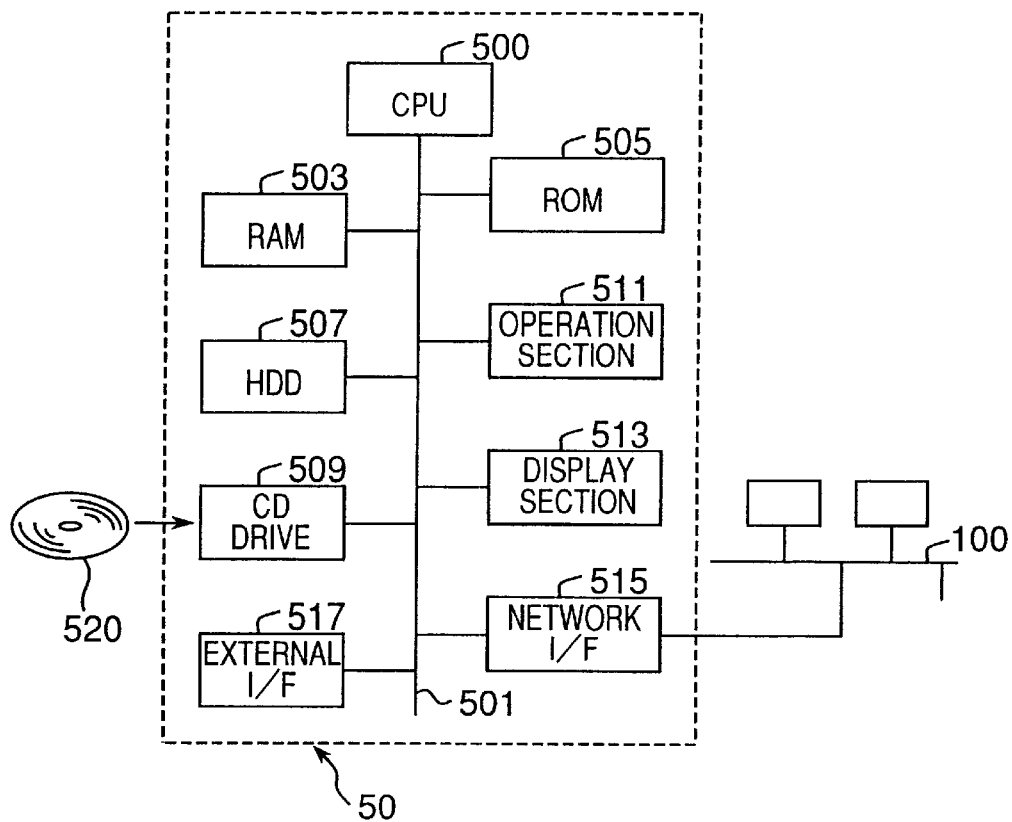
FIG. 1B is a hardware structural diagram of the layout pattern data correcting apparatus according to the present invention.

The layout pattern data correcting apparatus can be composed of information processing apparatus having a hardware structure shown in FIG. 1B, for example. In this case, a CPU 500 of the information processing apparatus executes a predetermined control program so that functions of the respective sections shown in FIG. 1A, namely, the operation of the layout pattern data correcting apparatus, mentioned later, can be realized. The programs to be executed by the CPU 500 can be provided by information recording medium such as CD-ROM 520.

In FIG. 1B, a layout pattern data correcting apparatus 50 has the CPU (Central Processing Unit) 500 for executing the control program. The apparatus 50 is constituted so that the CPU 500 is connected via a bus 501 to RAM (Random Access Memory) 503 and ROM (Read-Only Memory) 505 into which programs and data are stored, a display section 513 for displaying information, an operation sections 511 which comprises a keyboard, a mouse and the like and is operated by a user, a network interface section 515 for connecting to a network 100 such as LAN, and an external interface section 517 for connecting to an external information equipment are connected with each other. Moreover, the apparatus 50 is provided with a hard disk apparatus 507 as an auxiliary storage device, and a CD drive 509 which is an apparatus for reading programs or data from CD-ROM as information recording medium.

Operation of Layout Pattern Data Correcting Apparatus

There will be explained below the operation of the layout pattern data correcting apparatus having the above structure. FIG. 2 is a flow chart showing a main operation of the layout pattern data correcting apparatus. In the layout pattern data correcting apparatus, the deletion region side extracting section 3 reads a layout pattern from the layout pattern data storage 1, and refers to the rules stored in the deletion rule storage 2 so as to execute a process for extracting sides composing a region to be deleted in the layout pattern (S11) (details of this process will be explained later). Next, using the extracted sides, the deletion-use pattern generator 4 generates a deletion-use pattern as a figure pattern for deleting the region to be deleted (S12). Thereafter, a judgment is made as to whether or not, in all regions to be deleted included in the layout pattern, the sides composing each of the regions are extracted (S13). When the sides composing all the regions to be deleted are not extracted (NO at step S13), the process returns to step S11 to repeat the above steps. When the sides composing all the regions are extracted (YES at step S13), generated is a layout pattern which is obtained by deleting the regions to be deleted (protrusions, notches and steps) from the original layout pattern using the generated deletion-use pattern (S14). Corrected pattern from which the regions to be deleted are deleted is stored into the deleted layout pattern data storage 6.

In the present embodiment, the sides composing protrusions, notches or steps to be deleted are extracted from an original layout pattern, and the deletion-use patterns are generated based on those extracted sides. Then the regions of protrusions, notches and steps are removed from the layout pattern using the deletion-use patterns.

Extraction of Sides Composing Regions to be Deleted, and Generation of Deletion-use Patterns There will be detailed below the process at step S11 (namely, the process for extracting sides composing regions to be deleted such as protrusions, notches and steps) and the process for generating deletion-use figures at step S12.

Extraction of Protrusion Region

Figure 5:
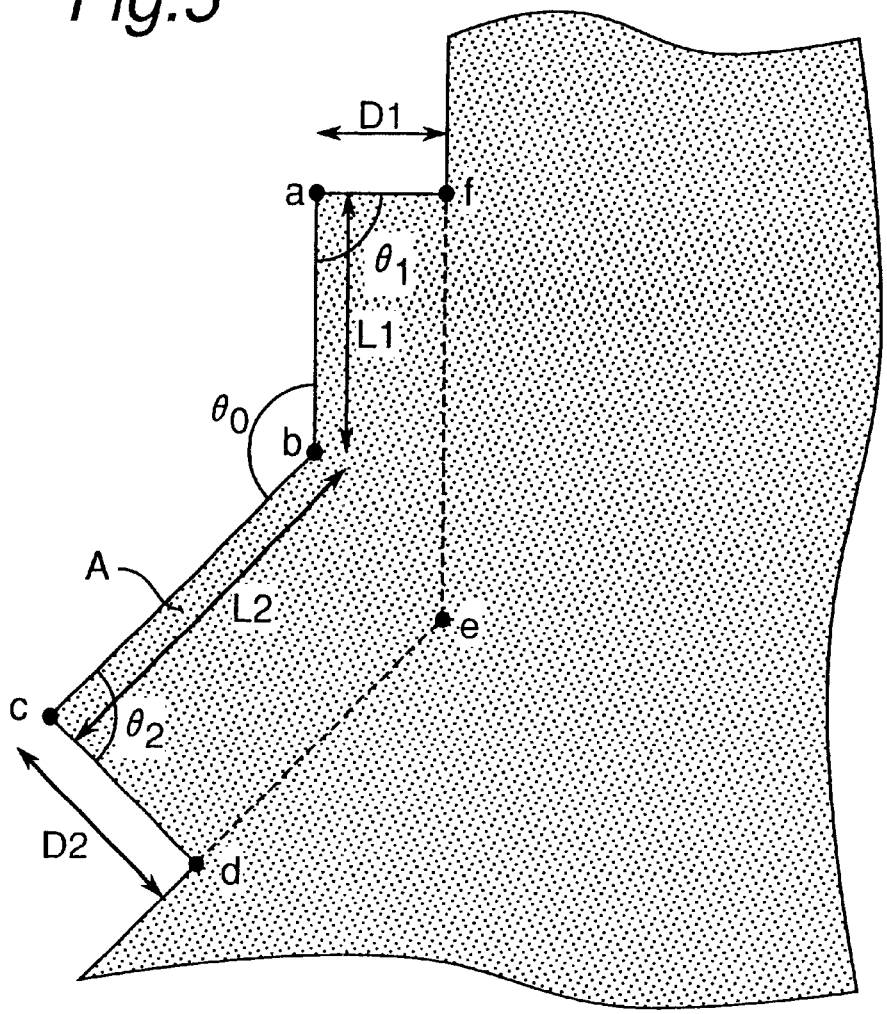
FIG. 5 is an enlarged diagram of the protrusion region for explaining the process for extracting the protrusion region.

There will be explained below the case where the region to be deleted is a protrusion region (for example, a protrusion 20 shown in FIG. 14) with reference to the flow chart of FIG. 3. FIG. 5 is an enlarged diagram of the protrusion 20 shown in FIG. 14.

With reference to FIGS. 3 and 5, two sides (a segment ab and a segment bc) are extracted (S111). Each of those sides has a predetermined length L1 or L2 (L1≦L2) respectively, and they form a predetermined angle of $\theta_0$ (90°≦$\theta_0$<180°) therebetween. Next, a side (a segment af) is extracted (S112). The side (segment af) is adjacent to the side with length of L1 (segment ab) and has a predetermined length D1 and forms a predetermined angle with the side (segment ab) of $\theta_1$ (90°≦$\theta_1$<180°). Next, a side (segment cd) is extracted (S113). The side (segment cd) is adjacent to the side (segment bc) with length of L2 and has a predetermined length of D2 and forms a predetermined angle with the side (segment bc) of $\theta_2$ (90°≦$\theta_2$<180°). Here, the values of the lengths L1, L2, D1 and D2, and the angles $\theta_0$, $\theta_1$ and $\theta_2$ are stored in the deletion rule storage 2.

Thereafter, a judgment is made as to whether or not all the above described sides (segments) can be detected (S114).

When all the sides are not extracted, it is determined that the protrusion region does not exist. When all the sides are extracted, it is determined that the protrusion region exists, and then a process for defining the protrusion region is executed as follows.

Namely, the intersectional point e is determined (S115), which is an intersectional point of a straight line parallel with the side (segment ab) with length of L1 and passing through a point f and a straight line parallel with the side (segment bc) with length of L2 and passing through a point d. Thereafter, a coordinate of the intersectional point e is approximated so that the intersectional point e is localized on a design grid (S116). There will be explained below the approximation of the coordinate of the intersectional point e.

Figure 6A:
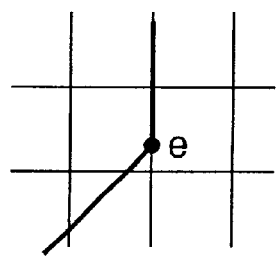
FIGS. 6A and 6B are diagrams for explaining an on-grid process for a calculated point of intersection.
Figure 6B:
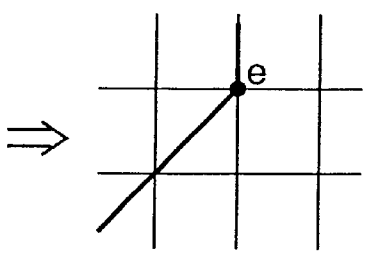

In the layout pattern data correcting apparatus, the layout pattern data are handled on a predetermined design grid. Therefore, the minimum unit of data to be treated in the layout pattern data correcting apparatus is a unit of the coordinates of the design grid. As mentioned above, the intersectional point e is obtained from the straight line which is parallel with the side (segment ab) with length of L1 and passes through the point f and the straight line which is parallel with the side (segment bc) with length of L2 and passes through the point d. Therefore the point e is not always obtained by calculation to be on the grid. Namely, as shown in FIG. 6A, the coordinate of the intersectional point e is not occasionally obtained on the grid and is shifted from the grid in calculation. In this case, the layout pattern data correcting apparatus cannot process the point e. Accordingly, as shown in FIG. 6B, it is necessary to approximate the point e so that the coordinate of the point e obtained by the calculation is localized on the design grid. In the present embodiment, out of some points on the grid which are in the vicinity of the calculated point e, one point is selected so that a difference between layout pattern data after deleting a protrusion and original layout pattern becomes minimum, and the coordinate of the point e is set on the selected point of the grid. Thus, a corrected data pattern which is the most approximate to the designed layout pattern can be obtained. In a simple manner, the obtained coordinate of the point e may be rounded off so as to be on the nearest point on the grid.

As mentioned above, when a protrusion region is determined, four sides which compose the protrusion region and have a predetermined relationship (for example, they are connected each other to form a substantially M shape) are extracted, and vertices which specify the region are obtained based on the information of the extracted sides.

Figures 7A, 7B:
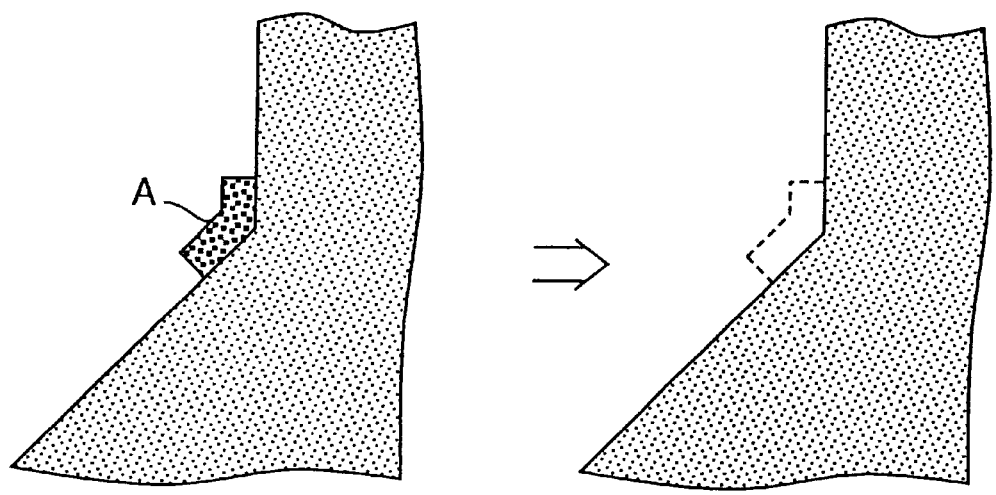
FIGS. 7A and 7B are diagrams for explaining deletion of a protrusion region from the layout pattern.

When respective sides composing the protrusion region to be deleted, namely, the vertices a, b, c, d, e and f are obtained, a region which is surrounded by the vertices a to f is determined as a deletion-use pattern (S117). For example, as shown in FIG. 7A, the protrusion portion A is extracted as the deletion-use pattern. Thereafter, the protrusion portion A is deleted from the original layout pattern data (NOT operation) so that a pattern after deletion is obtained as shown in FIG. 7B.

Extraction of Notch Region

Also in the case of a notch-shaped region (for example, a region 21 shown in FIG. 14), it can be extracted in the similar manner to the case of the protrusion region. Since a notch has the same shape as that of the protrusion, a figure A shown in FIG. 7 can be specified for the notch. However, the method of extracting the notch region is different from the extracting method of the protrusion region in that the notch region is extracted outside the region of a layout pattern. Therefore, in the case where an extracted region is extracted in a region within the original layout pattern, the layout pattern data correcting apparatus judges that the extracted region is a protrusion. In the case where an extracted region is extracted outside the original layout pattern, the apparatus judges that the extracted region is a notch. A notch region is deleted or removed by executing an addition process (OR operation) to the original layout pattern with a deletion-use pattern corresponding to the notch region.

Figure 10A:
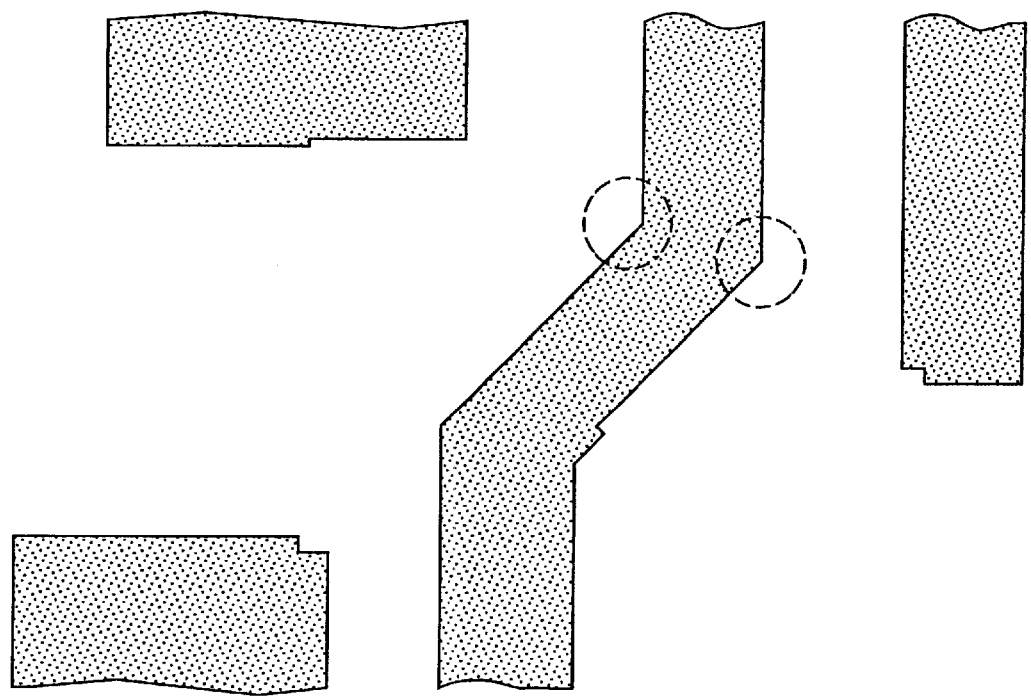
FIG. 10A is a diagram for explaining a layout pattern after the protrusion region is deleted from the pattern shown in FIG. 14A.
Figure 14A:
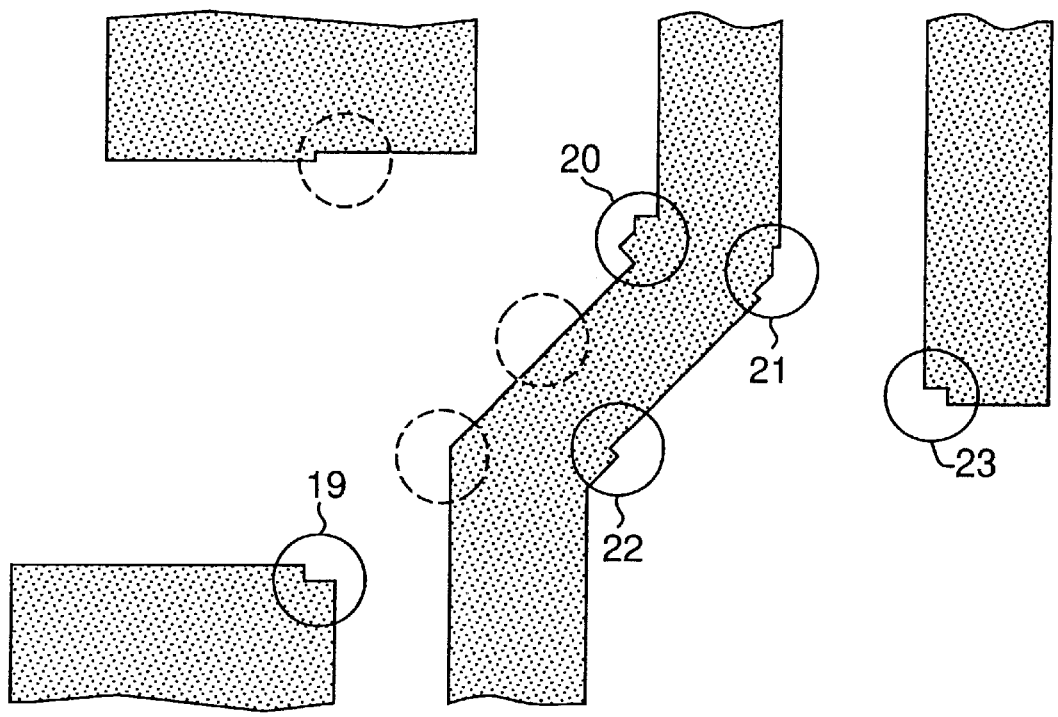
FIG. 14A is a diagram showing layout patterns after deletion according to the prior spacing check method.

FIG. 10A shows a result of removing protrusion and notch regions from the pattern shown in FIG. 14A.

Extraction of Step Region

Figure 8A:
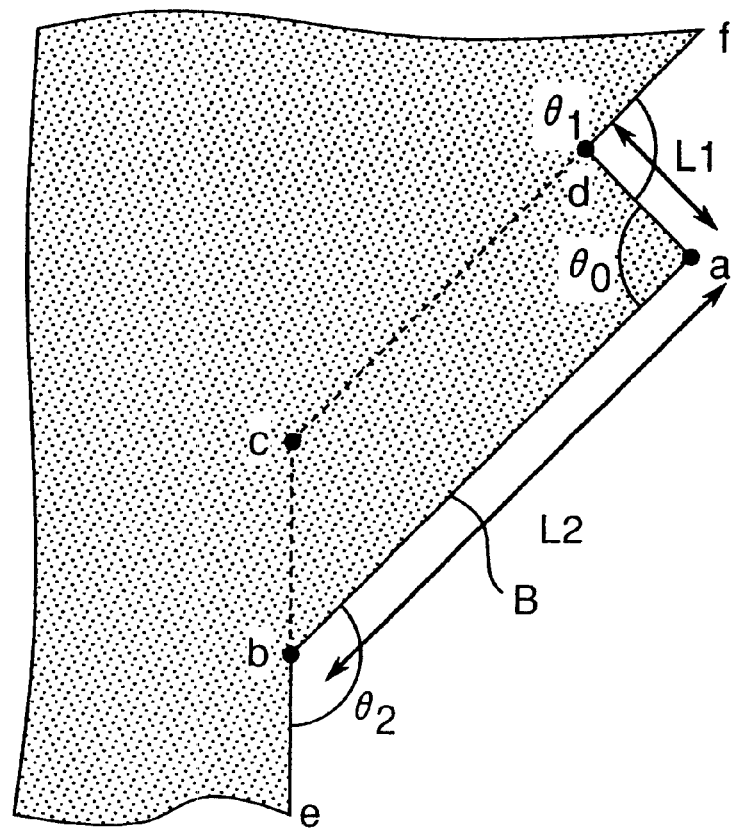
FIG. 8A is a diagram of the protrusion region for explaining a process for extracting a step-shaped region with one shape.

There will be explained below the case where a step-shaped region (for example, a region 22 or a region 27 shown in FIG. 14) is to be deleted with reference to the flow chart of FIG. 4. FIG. 8A is an enlarged diagram of the region 22 (or region 27) shown in FIG. 14.

With reference to FIGS. 4 and 8A, two sides (segments ad and ab) which have predetermined lengths L1 and L2 (L1≦L2) respectively and form a predetermined angle of $\theta_0$ (90°≦$\theta_0$<180°) therebetween, are extracted (S121). Next, a side (segment df) which is adjacent to the side (segment ad) with length of L1 and forms a predetermined angle of $\theta_1$ (90°≦$\theta_1$<180°) with the side (segment ad), is extracted (S122). Next, a side (segment be) which is adjacent to the side (segment ab) with length of L2 and forms an angle of $\theta_2$ (90°≦$\theta_2$<180°) with the side (segment ab), is extracted (S123). Here, the segments df and be have predetermined lengths, respectively. The values of the angles $\theta_0$, $\theta_1$ and $\theta_2$ formed by the sides with lengths L1 and L2 are also stored in the deletion rule storage 2.

A judgment is made as to whether all the sides (segments) can be detected (S124). When all the sides are not extracted, it is determined that a step region does not exist there. When all the sides are extracted, it is determined that a step region exists, and further a process for defining a whole of the step region is executed as follows.

Namely, an intersectional point c of a straight line which is parallel with the side (segment ab) with length of L2 and passes through the point d and an extended line of the side (segment be) is obtained (S125). Thereafter, a coordinate of the intersectional point c is approximated so that the intersectional point c is localized on one coordinate of the design grid (S126).

Figure 9A:
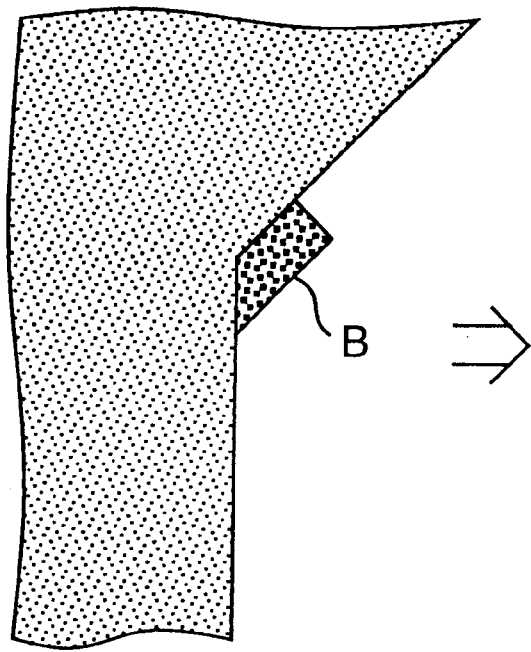
FIGS. 9A and 9B are diagrams for explaining deletion of a step-shaped region from the layout pattern.
Figure 9B:
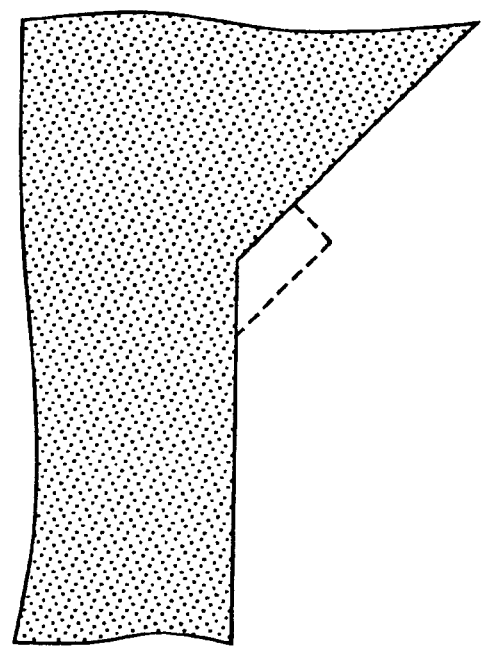

When a step region is detected as described above, four sides which compose the step region and are connected into a substantially M shape are extracted, and then vertices which specify the region are obtained based on the information about the extracted sides. When the sides composing the region to be deleted, namely, vertices a, b, c and d are obtained in such a manner, the region which is surrounded by the vertices a to d can be obtained as a step region to be deleted (S127). For example, as shown in FIG. 9A, a step figure B is obtained as a deletion-use pattern, and the step figure B is deleted from an original pattern so that a pattern after the deletion can be obtained as shown in FIG. 9B.

Figure 8B:
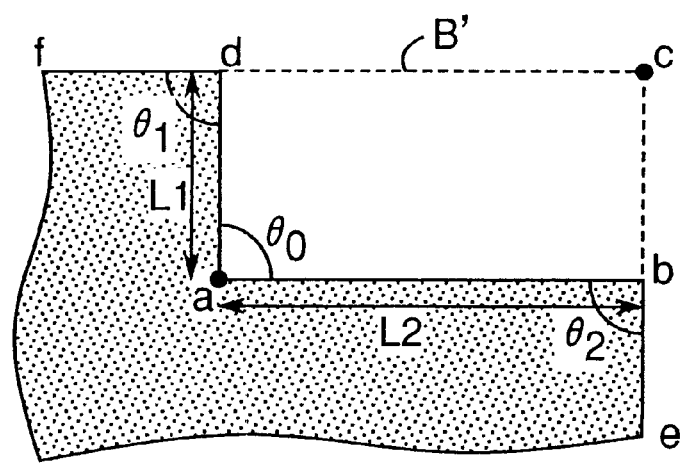
FIG. 8B is a diagram of the protrusion region for explaining a process for extracting a step-shaped region with another shape.
Figure 10B:
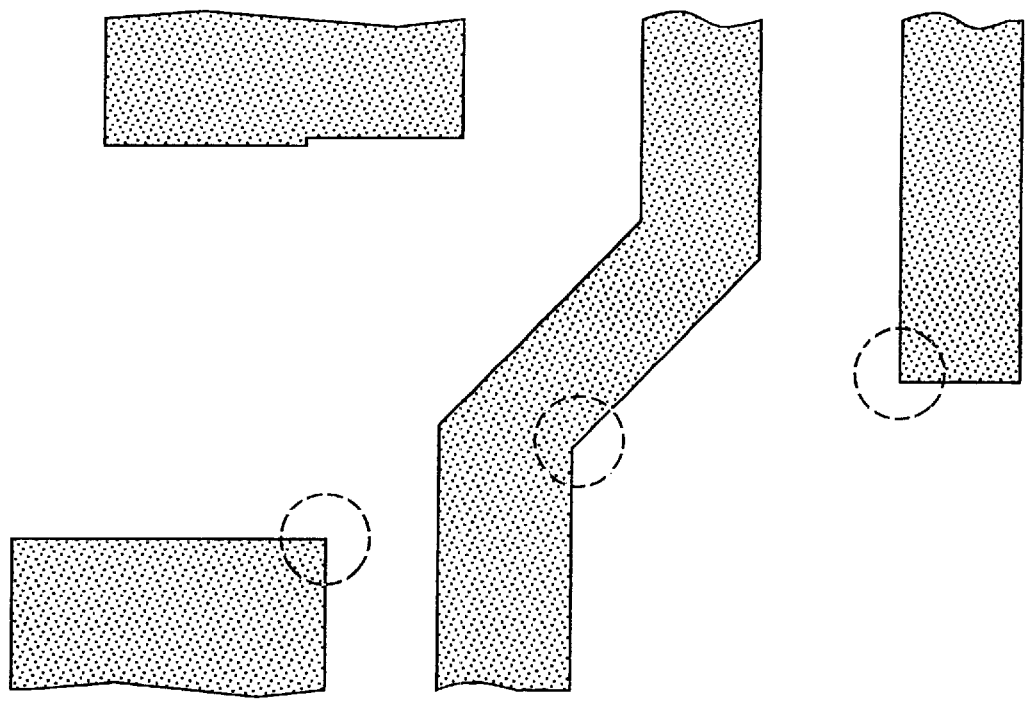
FIG. 10B is a diagram for explaining a layout pattern after the step-shaped region is deleted.
Figure 11:
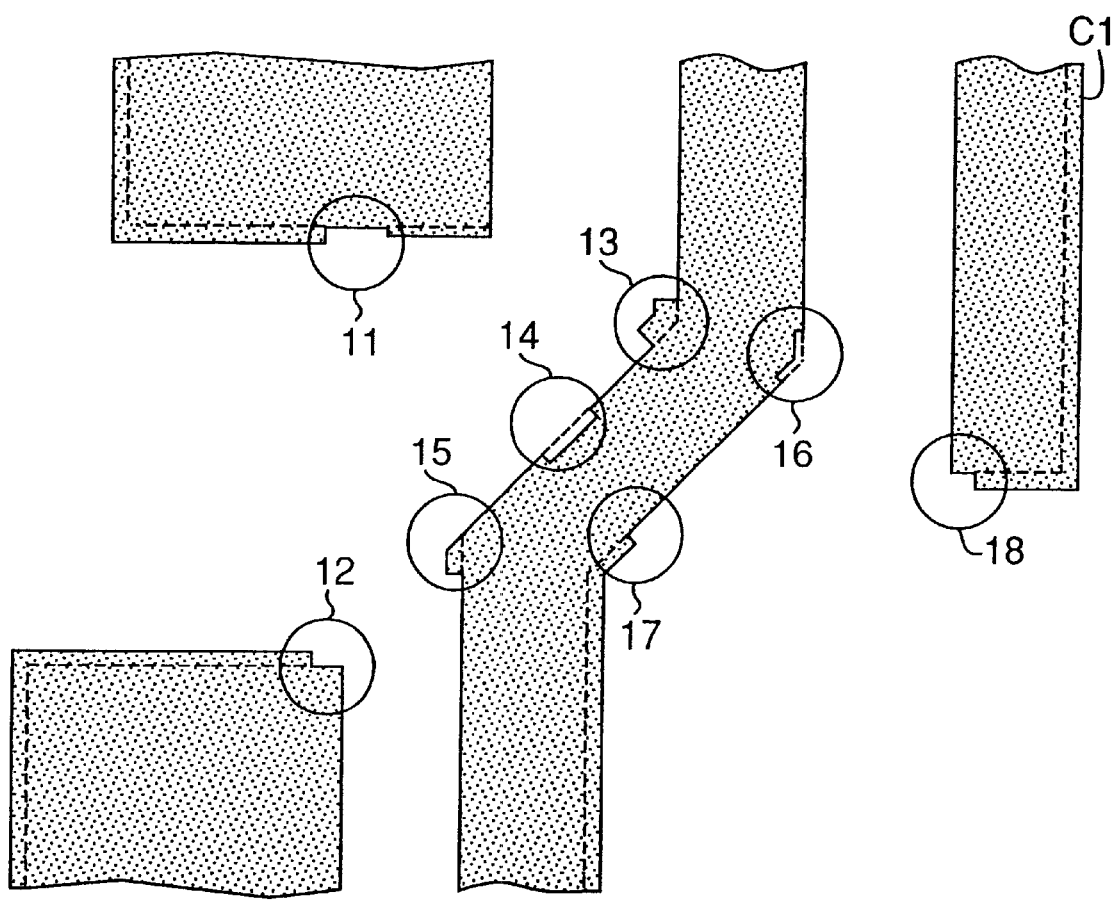
FIG. 11 is a diagram showing layout patterns after an optical proximity effect correcting (OPC) process.
Figure 12A:
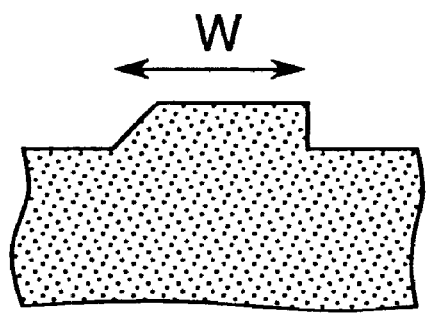
FIGS. 12A to 12C are diagrams for explaining states that the protrusion figure is deleted by using a prior spacing check method.
Figure 12B:
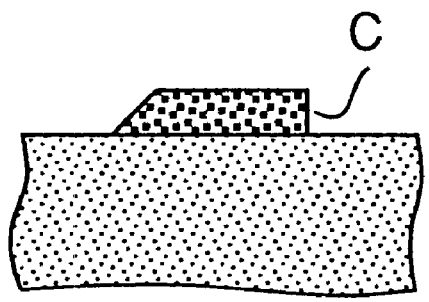
Figure 12C:
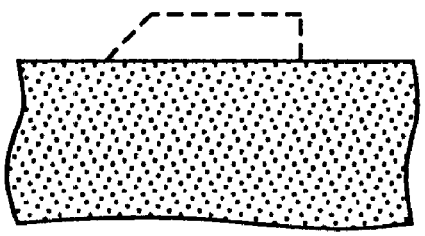
Figure 13A:
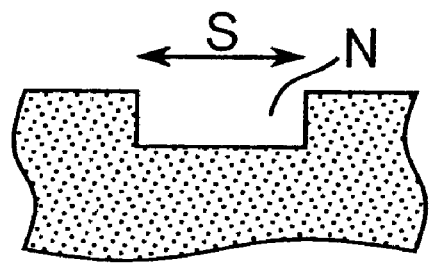
FIGS. 13A to 13C are diagrams for explaining states that the notch figure is deleted by using a prior sizing process.
Figure 13B:
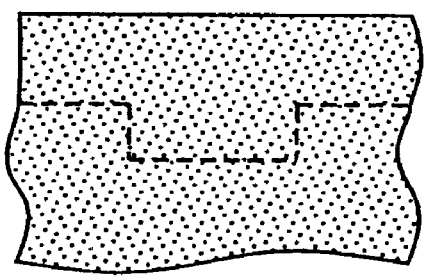
Figure 13C:
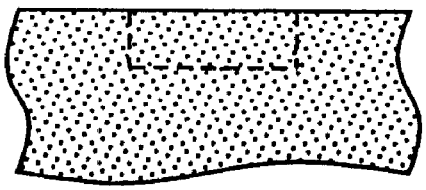
Figure 14B:
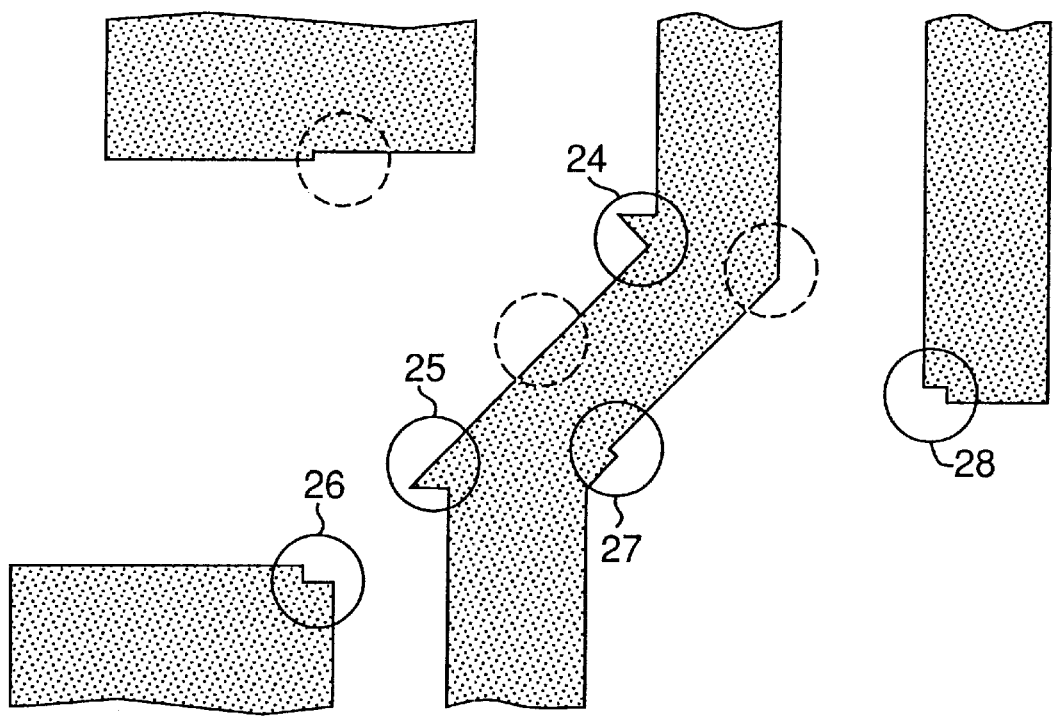
FIG. 14B is a diagram showing layout patterns after deletion according to the prior sizing process.

A step 19 which has another shape shown in FIG. 14 can also be extracted in the similar manner. FIG. 8B is an enlarged diagram of the step 19 shown in FIG. 14A. In this case, a figure B' comprising vertices a, b, c and d is extracted, and the figure B' is added (OR operation) to the original layout pattern so that the notch pattern is deleted. FIG. 10B shows a result of further deleting step regions from the pattern shown in FIG. 10A.

As mentioned above, in the layout pattern data correcting apparatus of the present embodiment, sides which have a predetermined relationship between lengths, angles and the like are extracted, and deletion-use patterns are generated from the extracted sides. Then the deletion-use patterns are deleted from the original layout pattern to correct the layout pattern. For this reason, pattern data with less number of vertices can be obtained, and thus a data amount in the layout pattern data can be reduced. Namely, according to the layout pattern data correcting apparatus of the present embodiment, in the process of manufacturing a semiconductor device, a pattern skew which is caused by a pattern forming process such as optical lithography and etching can be corrected without increasing a pattern data amount.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. An apparatus of correcting layout pattern data, comprising:
    a side extracting section for extracting sides composing a region to be deleted having a predetermined shape in a layout pattern of a circuit;
    a deletion-use pattern generator for generating a deletion-use pattern which is used to delete the region to be deleted, based on the extracted sides; and
    an operation section for executing a predetermined operation to the layout pattern with the deletion-use pattern to remove the region to be deleted from the original layout pattern.

2. The apparatus according to claim 1, wherein said side extracting section extracts, from the layout pattern, a first side which has a predetermined length, a second side which has a predetermined length longer than the first side and forms a predetermined angle with the first side, a third side which is adjacent to the first side and forms a predetermined angle with the first side, and a fourth side which is adjacent to the second side and forms a predetermined angle with the second side.

3. The apparatus according to claim 2, wherein said deletion-use pattern generator determines an intersectional point of a first straight line with a second straight line and generates using the intersectional point the deletion-use pattern to delete a protrusion or notch region, and wherein said first straight line extends parallel with the first side and passing through an end of the third side spaced from the first side, and said second straight line extends parallel with the second side and passing through an end of the fourth side spaced from the second side.

4. The apparatus according to claim 2, wherein said deletion-use pattern generator determines an intersectional point of a straight line which extends parallel with the second side and passes through an end of the third side contacting with the first side, and an extended line of the fourth side, and generates using the intersectional point the deletion-use pattern for deleting a step shaped region.

5. The apparatus according to claim 3, wherein the each side of the pattern is specified according to coordinate on a predetermined grid, and when the intersectional point is not localized on the grid, one point on the grid is selected so that a difference in layout pattern shapes becomes minimum between before and after deleting the region to be deleted, and the coordinate of the intersectional point is localized on the selected point on the grid.

6. The apparatus according to claim 4, wherein the each side of the pattern is specified according to coordinate on a predetermined grid, and when the intersectional point is not localized on the grid, one point on the grid is selected so that a difference in layout pattern shapes becomes minimum between before and after deleting the region to be deleted, and the coordinate of the intersectional point is localized on the selected point on the grid.

7. A method of correcting layout pattern data, comprising:
    extracting sides composing a region to be deleted having a predetermined shape in a layout pattern of a circuit;
    generating a deletion-use pattern which is used to delete the region to be deleted, based on the extracted sides; and
    executing a predetermined operation to the layout pattern with the deletion-use pattern to remove the region to be deleted from the original layout pattern.

8. The method according to claim 7, wherein said extracting comprises extracting, from the layout pattern, a first side which has a predetermined length, a second side which has a predetermined length longer than the first side and forms a predetermined angle with the first side, a third side which is adjacent to the first side and forms a predetermined angle with the first side, and a fourth side which is adjacent to the second side and forms a predetermined angle with the second side.

9. The method according to claim 8, wherein said generating comprises determining an intersectional point of a first straight line with a second straight line and generating the deletion-use pattern for deleting a protrusion or notch region using the intersectional point, and wherein said first straight line extends parallel with the first side and passing through an end of the third side spaced from the first side, and said second straight line extends parallel with the second side and passing through an end of the fourth side spaced from the second side.

10. The method according to claim 8, wherein said generating comprises determining a intersectional point of a straight line which extends parallel with the second side and passes through an end of the third side contacting with the first side, and an extended line of the fourth side, and generating the deletion-use pattern for deleting a step shaped region using the intersectional point.

11. The method according to claim 9 , wherein the each side of the pattern is specified according to coordinate on a predetermined grid, and when the intersectional point is not localized on the grid, one point on the grid is selected so that a difference in layout pattern shapes becomes minimum between before and after deleting the region to be deleted, and the coordinate of the intersectional point is localized on the selected point on the grid.

12. The method according to claim 10, wherein the each side of the pattern is specified according to coordinate on a predetermined grid, and when the intersectional point is not localized on the grid, one point on the grid is selected so that a difference in layout pattern shapes becomes minimum between before and after deleting the region to be deleted, and the coordinate of the intersectional point is localized on the selected point on the grid.

13. A information recording medium for storing a program for controlling an apparatus of correcting a layout pattern of a circuit, said program making said apparatus execute the following functions:
    a side extracting function for extracting sides composing a region to be deleted having a predetermined shape in a layout pattern of a circuit;
    a deletion-use pattern generating function for generating a deletion-use pattern which is used to delete the region to be deleted, based on the extracted sides; and a figure operation function for executing a predetermined operation to the layout pattern with the deletion-use pattern to remove the region to be deleted from the original layout pattern.

14. The medium according to claim 13, wherein said side extracting function extracts, from the layout pattern, a first side which has a predetermined length, a second side which has a predetermined length longer than the first side and forms a predetermined angle with the first side, a third side which is adjacent to the first side and forms a predetermined angle with the first side, and a fourth side which is adjacent to the second side and forms a predetermined angle with the second side.

15. The medium according to claim 14, wherein said deletion-use pattern generating function determines an intersectional point of a first straight line with a second straight line and generates, using the intersectional point, the deletion-use pattern to delete a protrusion or notch region, and wherein said first straight line extends parallel with the first side and passing through an end of the third side spaced from the first side, and said second straight line extends parallel with the second side and passing through an end of the fourth side spaced from the second side.

16. The method according to claim 14, wherein said deletion-use pattern generator determines an intersectional point of a straight line which extends parallel with the second side and passes through an end of the third side contacting with the first side, and an extended line of the fourth side, and generates using the intersectional point the deletion-use pattern for deleting a step shaped region.

17. The medium according to claim 15, wherein the each side of the pattern is specified according to coordinate on a predetermined grid, and when the intersectional point is not localized on the grid, one point on the grid is selected so that a difference in layout pattern shapes becomes minimum between before and after deleting the region to be deleted, and the coordinate of the intersectional point is localized on the selected point on the grid.

18. The medium according to claim 16, wherein the each side of the pattern is specified according to coordinate on a predetermined grid, and when the intersectional point is not localized on the grid, one point on the grid is selected so that a difference in layout pattern shapes becomes minimum between before and after deleting the region to be deleted, and the coordinate of the intersectional point is localized on the selected point on the grid.

* * * * *

UNITED STATES PATENT AND TRADEMARK OFFICE
CERTIFICATE OF CORRECTION

PATENT NO.    : 6,536,015 B2
DATED         : March 18, 2003
INVENTOR(S)   : Yusaku Ono It is certified that error appears in the above-identified patent and that said Letters Patent is hereby corrected as shown below:

<u>Title page,</u>
Item [30], Foreign Application Priority Data, change "2000-203866" to
-- 2000-203886 --

Signed and Sealed this

First Day of July, 2003

JAMES E. ROGAN
*Director of the United States Patent and Trademark Office*